(12) United States Patent
Jang et al.

(10) Patent No.: US 7,449,907 B2
(45) Date of Patent: Nov. 11, 2008

(54) TEST UNIT TO TEST A BOARD HAVING AN AREA ARRAY PACKAGE MOUNTED THEREON

(75) Inventors: Se-young Jang, Seoul (KR); Masaharu Tsukue, Suwon-si (KR); Young-jun Moon, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 170 days.

(21) Appl. No.: 11/316,826

(22) Filed: Dec. 27, 2005

(65) Prior Publication Data

US 2006/0139043 A1 Jun. 29, 2006

(30) Foreign Application Priority Data

Dec. 28, 2000 (KR) .................... 10-2004-0113917

(51) Int. Cl.
*G01R 31/02* (2006.01)
(52) U.S. Cl. .................. 324/761; 324/755; 324/756
(58) Field of Classification Search .................. None
See application file for complete search history.

(56) References Cited

U.S. PATENT DOCUMENTS

| | | | |
|---|---|---|---|
| 6,452,502 B1 * | 9/2002 | Dishongh et al. | 340/653 |
| 6,535,005 B1 * | 3/2003 | Field | 324/755 |
| 6,564,986 B1 | 5/2003 | Hsieh | |
| 6,788,092 B2 | 9/2004 | Cheng et al. | |

FOREIGN PATENT DOCUMENTS

JP 09-246426 9/1997

OTHER PUBLICATIONS

Korean Office Action dated May 23, 2006 issued in KR 2004-113917.

* cited by examiner

*Primary Examiner*—Minh N Tang
(74) *Attorney, Agent, or Firm*—Stanzione & Kim, LLP

(57) ABSTRACT

A test unit to test a board having an area array package mounted therein includes the board, the area array package having an electronic component, a plurality of package pins including a plurality of contact pins connected with the electronic component and a plurality of no-contact pins not connected with the electronic component, and a plurality of contact members respectively provided on the plurality of contact pins and the plurality of no-contact pins to connect the plurality of package pins with the board, a plurality of board contact parts provided on the board and connected with the plurality of contact members to be connected with the plurality of package pins, at least one first connection part provided in the area array package to electrically connect the plurality of no-contact pins with each other in pairs, at least one second connection part provided on the board to electrically connect the plurality of board contact parts with each other in pairs to form a circuit line arranged alternately with the first connection part through the plurality of contact members, and at least one test point provided at opposite ends of the circuit line to measure a resistance between the first and second connection parts. Thus, the test unit can test a connection state of the plurality of contact members without difficulty.

7 Claims, 4 Drawing Sheets

TEST UNIT TO TEST A BOARD HAVING AN AREA ARRAY PACKAGE MOUNTED THEREON

CROSS-REFERENCE TO RELATED APPLICATIONS

This application claims the benefit of Korean Patent Application No. 2004-113917 filed on Dec. 28, 2004, in the Korean Intellectual Property Office, the disclosure of which is incorporated herein by reference in its entirety.

BACKGROUND OF THE INVENTION

1. Field of the Invention

The present general inventive concept relates to a test unit to test a board having an area array package mounted thereon, and more particularly, to a test unit placed in an area array package and a board to test a connection state between the area array package and the board.

2. Description of the Related Art

An area array package is used for connecting electronic components to a board by soldering, or the like, and includes a ball grid array (BGA) package, a chip size package (CSP), a wafer level package (WLP), a flip chip package, or the like.

Hereinafter, the BGA package will be described as the area array package.

A conventional structure for mounting the BGA package to the board is disclosed in Korean Patent Application No. 1995-10124. The BGA package comprises a semiconductor chip, a plurality of solder balls positioned on the bottom of the semiconductor chip to be adhered to the board, and a plurality of supporters protruding outward and downward from the plurality of solder balls. Further, the board comprises a plurality of connection parts to be connected with the plurality of solder balls on the BGA package, and a plurality of supporting grooves formed outside the plurality of the connection parts to accommodate the supporters therein.

In the conventional structure for mounting the BGA package to the board, the plurality of supporters are inserted in the plurality of supporting grooves on the board, and at the same time the plurality of solder balls are connected to the plurality of connection parts on the board, thereby enhancing an assembling efficiency and decreasing a possibility of creating a defective connection of one of the plurality of solder balls.

However, the semiconductor chip which comprises the BGA package generates heat while operating. The heat causes the BGA package to expand. The BGA package and the plurality of solder balls adhered to the board then crack, and thus a defective connection may be created between one or more of the solder balls and the BGA package, or between the one or more solder balls and the board.

However, the conventional structure for mounting the BGA package to the board does not include a test unit to inspect the plurality of solder balls to detect the defective connection between the one or more solder balls and the BGA package, or between the one or more solder balls and the board.

SUMMARY OF THE INVENTION

Accordingly, the present general inventive concept provides a test unit to test a board having an area array package mounted thereon, in which a connection state of a contact member can be inspected without difficulty.

Additional aspects of the present general inventive concept will be set forth in part in the description which follows and, in part, will be obvious from the description, or may be learned by practice of the general inventive concept.

The foregoing and/or other aspects of the present general inventive concept are achieved by providing a test unit to test a board having an area array package mounted thereon. The test unit comprises the board, the area array package including an electronic component, a plurality of package pins including a plurality of contact pins connected with the electronic component and a plurality of no-contact pins not connected with the electronic component, and a plurality of contact members respectively provided on the plurality of contact pins and the plurality of no-contact pins to connect the plurality of package pins with the board, a plurality of board contact parts provided on the board and connected with the plurality of contact members to be connected with the plurality of package pins, at least one first connection part provided in the area array package to electrically connect the plurality of no-contact pins with each other in pairs, at least one second connection part provided on the board to electrically connect the plurality of board contact parts with each other in pairs to form a circuit line arranged alternately with the first connection part through the plurality of contact members, and at least one test point provided at opposite ends of the circuit line to measure a resistance between the first and second connection parts.

At least one of the plurality of no-contact pins that is selected to provide the at least one first connection part may comprise an outermost package pin.

The first and second connection part may comprise a conductive metal line.

The at least one test point may be provided on the board and may be electrically connected to a pair of board contact parts that are connected with the first connection part through the plurality of contact members.

The package may comprise a ball grid array package and the plurality of contact members may comprise a plurality of solder balls.

The foregoing and/or other aspects of the present general inventive concept are also achieved by providing a test apparatus, comprising a package having a pattern defined by a plurality of package pins, a board having the pattern defined by a plurality of board connection parts, a plurality of contact members disposed between the plurality of package pins and the plurality of board connection parts to form a plurality of interconnections therebetween, and a test unit including a circuit line formed through one or more selected board connection parts and one or more selected package pins by a plurality of connection lines to test one or more of the interconnections between the board and the package.

The forgoing and/or other aspects of the present general inventive concept are also achieved by providing a test apparatus, comprising a board having a plurality of board connections, a package including a plurality of test pins extending therefrom and a plurality of corresponding contact members to connect the plurality of test pins to corresponding board connections, and a test unit to form a circuit including a plurality of interconnections between the test pins and the corresponding board connections through the corresponding contact members and to determine a state of the plurality of interconnections by measuring one or more properties of the circuit.

The foregoing and/or other aspects of the present general inventive concept are also achieved by providing a test unit to test a package and board assembly having a plurality of interconnections to connect to one another. The test unit comprises a first connection part disposed on the package to connect at least a first interconnection with a second interconnection, a second connection part disposed on the board to connect the second interconnection with a third interconnection such that the first connection part is connected to the second connection part through the second interconnection part, and a test point between the first and second connection parts across which the plurality of interconnections are tested.

BRIEF DESCRIPTION OF THE DRAWINGS

These and other aspects of the present general inventive concept will become apparent and more readily appreciated from the following description of the embodiments, taken in conjunction with the accompany drawings of which.

DETAILED DESCRIPTION OF THE PREFERRED EMBODIMENTS

Figure 1:
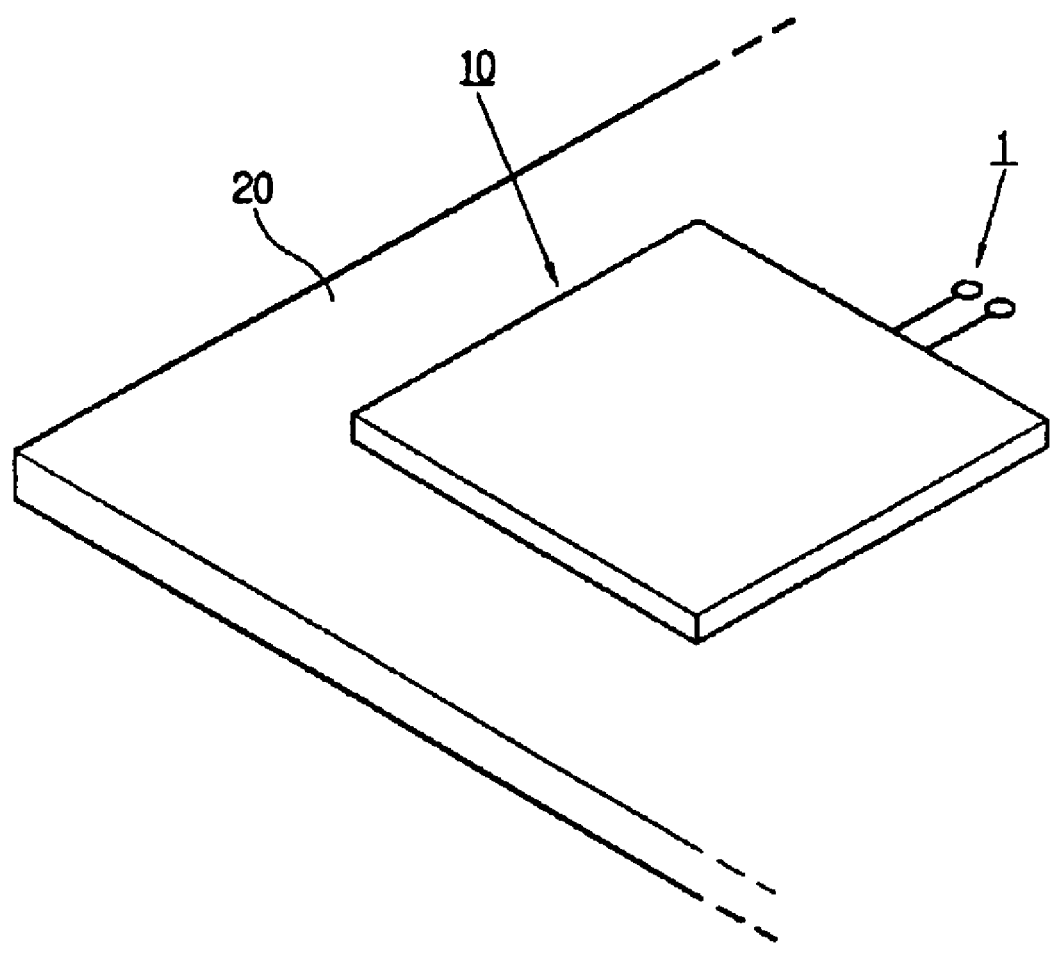
FIG. 1 is a perspective view illustrating a package and a board with a test unit according to an embodiment of the present general inventive concept.

Reference will now be made in detail to the embodiments of the present general inventive concept, examples of which are illustrated in the accompanying drawings, wherein like reference numerals refer to like elements throughout. The embodiments are described below so as to explain the present general inventive concept by referring to the figures.

Figure 2:
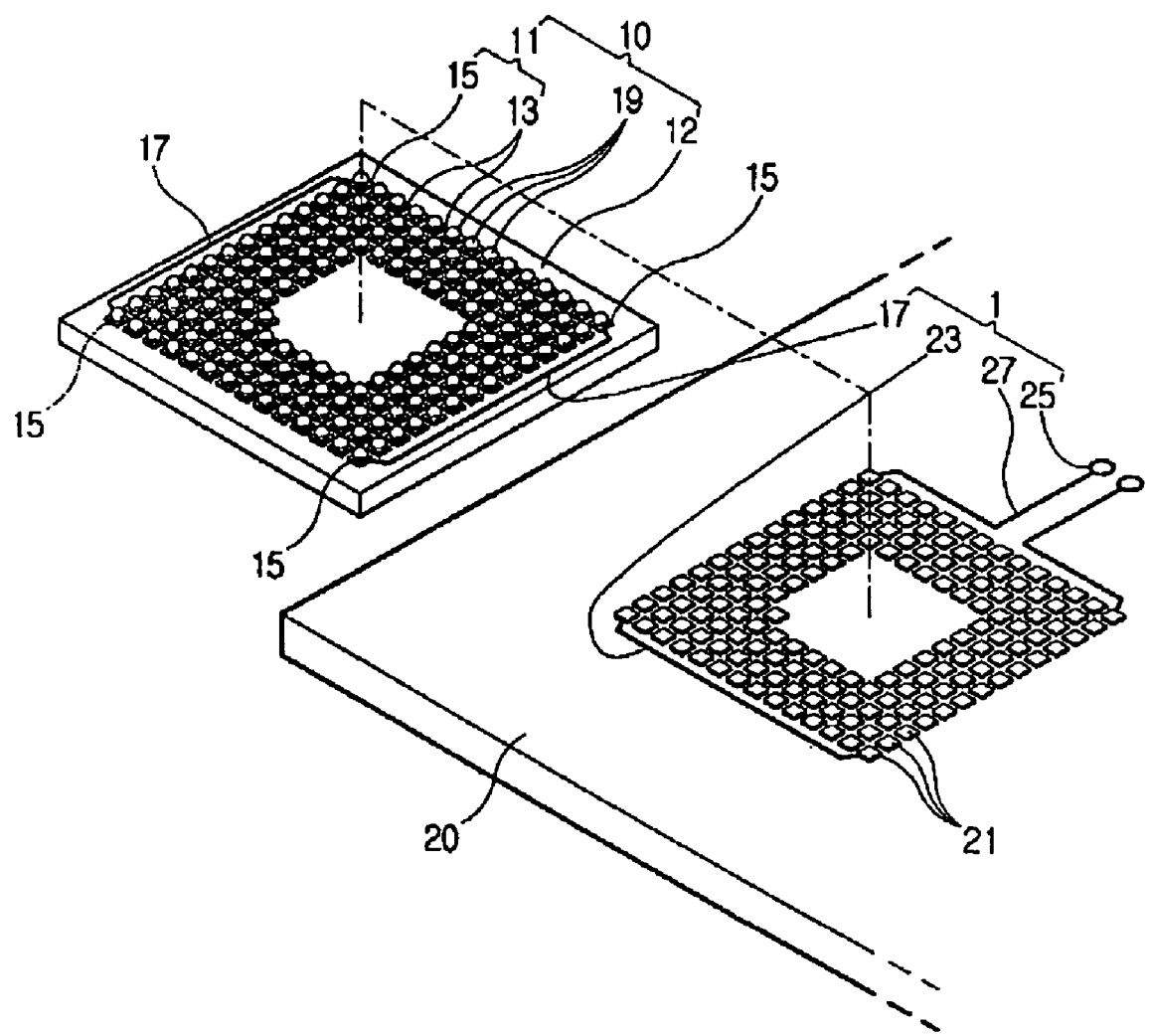
FIG. 2 is an exploded perspective view illustrating the package and the board with the test unit of FIG. 1.
Figure 3:
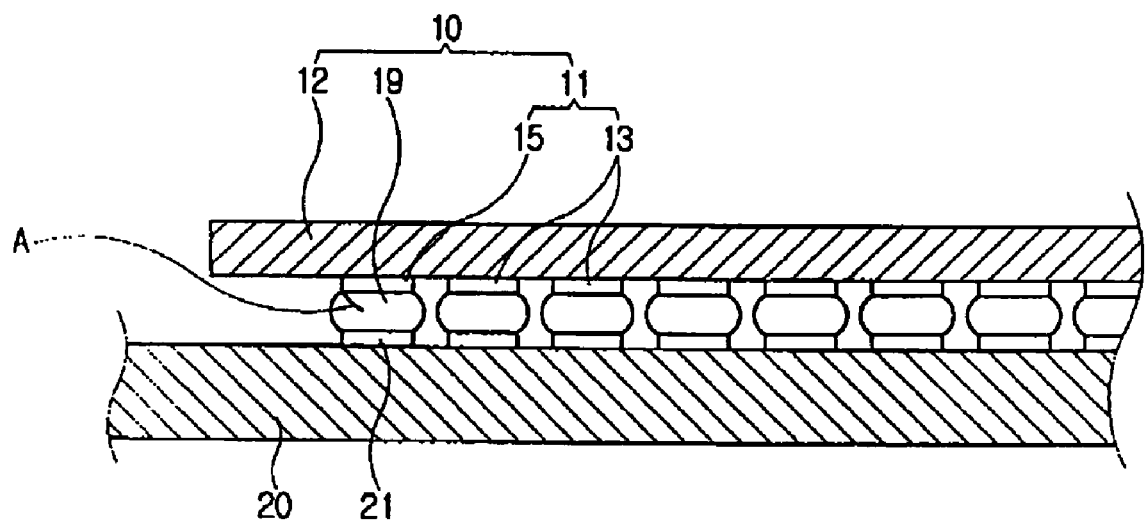
FIG. 3 is a partial sectional view illustrating the package and the board with the test unit of FIG. 1.

FIGS. 1 through 3 are different views illustrating a package 10 (i.e., an array area package) and a board 20 with a test unit 1 according to an embodiment of the present general inventive concept. Referring to FIGS. 1 through 3, the test unit 1 is used on the board 20 having the area array package 10 mounted thereon. The test unit 1 inspects a connection state between the package 10 and the board 20. The test unit 1 comprises at least one first connection part 17 provided in the package 10 to electrically connect a plurality of no-contact (NC) pins 15 (described below) with each other in pairs, at least one second connection part 23 provided on the board 20 to connect a plurality of board contact parts 21 with each other in pairs so as to form a circuit line alternately arranged relative to the first connection part 17 through a contact member 19 (described below), and test points 25 positioned at opposite ends of the circuit line to measure a resistance between the first connection part 17 (i.e., the at least one first connection part 17) and the second connection part 23 (i.e., the at least one second connection part 23).

The board 20 comprises the plurality of board contact parts 21 to be connected with a plurality of package pins 11 of the package 10 (described below), respectively.

The board contact parts 21 are made of conductive metal to be electrically connected with a plurality of contact members 19 in the package 10. The board contact parts 21 are arranged as a lattice pattern to correspond to the package pins 11.

The package 10 comprises an electronic component 12 (e.g., a semiconductor chip). The package pins 11 comprise a plurality of contact pins 13 placed outside the electronic component 12 and are electrically connected with the electronic component 12. The package pins 11 further comprise the plurality of NC pins 15 that are electrically disconnected from the electronic component 12, and the plurality of contact members 19 are respectively provided on the package pins 11 (i.e., the contact pins 13 and the NC pins 15) to contact the board 20. For example, the package 10 may include a ball grid array (BGA) package. Alternatively, the package 10 may include a chip size package (CSP), a wafer level package (WLP), a flip chip, or the like. The NC pins 15 may be test pins used to test connections between the board 20 and the package 10.

The electronic component 12 may be a semiconductor chip, such as a memory chip or the like. The electronic component 12 may generate heat while operating. As a result, a temperature of the package 10 may increase and the package 10 may expand.

As illustrated in FIGS. 2 and 3, the package pins 11 are positioned on a bottom of the electronic component 12, and are arranged as a lattice pattern to correspond to the board contact parts 21. The package pins 11 are made of conductive material to be electrically connected with the contact members 19.

Among the package pins 11, the plurality of contact pins 13 are electrically connected with the electronic component 12 and are connected to the board contact parts 21 through the contact members 19, thereby communicating with the electronic component 12 using an electrical signal.

Among the package pins 11, the plurality of NC pins 15 are not electrically connected with the electronic component 12 and are connected to the board contact parts 21 through the contact members 19. However, the NC pins 15 cannot communicate with the electronic component 12 using the electrical signal. For example, the NC pins 15 are placed at outermost positions of the lattice pattern formed by the package pins 11. As illustrated in FIG. 2, four of the NC pins 15 are placed at four corners of the lattice pattern formed by the package pins 11.

The contact members 19 are used to connect the package pins 11 with the board contact parts 21. For example, the contact members 19 may be solder balls used for the BGA package. Alternatively, the contact members 19 may have various other shapes to connect the package pins 11 with the board contact parts 21. As illustrated in FIG. 3, in a state in which the contact members 19 are in contact with the package pins 11 and the board contact parts 21, one or more of the contact members 19 may be cracked (see "A" of FIG. 3) as the electronic component 12 heats up and expands during operation. The crack A causes a defective connection between the corresponding package pin 11 and the corresponding board contact part 21. The crack A may be more likely to arise in the contact member 19 located at the outermost position of the lattice pattern formed by the package pins 11, which is affected more by the expansion. Thus, since the package pins 11 located at the outermost position of the lattice pattern may be NC pins 15, the crack A is more likely to occur in the contact members 19 that correspond to the NC pins 15.

The first connection part 17 is provided in the package 10 and connects the NC pins 15 with each other in pairs. The first connection part 17 connects at least one pair of the plurality of NC pins 15 with each other such that the NC pins 15 are connected with the plurality of contact members 19 to be inspected. For example, the first connection part 17 may connect the pair of NC pins 15 located at the outermost positions of the lattice pattern formed by the package pins 11. As illustrated in FIG. 2, two first connection parts 17 connect four NC pins 15 located at the outermost positions with each other in pairs. The first connection part 17 may be arranged along a first two sides of the lattice pattern formed by the package pins 11. The first connection part 17 is made of a conductive metal line to connect the pairs of the NC pins 15 with each other. Alternatively, the first connection part 17 may have various other shapes that connect the pairs of the NC pins 15 with each other.

The second connection part 23 is provided on the board 20 and electrically connects the plurality of board contact parts 21 with each other in pairs to be alternately arranged relative to the first connection part 17 through the contact members 19. The board contact parts 21 may also be arranged in the lattice pattern to correspond to the package pins 11. Thus, the second connection part 23 is arranged along a second side of the lattice pattern formed by the board contact parts 21 that lies between the first two sides where the first connection part 17 is arranged on the package 10. The second connection part 23 connects at least one pair of board contact parts 21 with each other such that the board contact parts 21 are connected with the plurality of contact members 19 to be inspected, thereby forming an electric circuit line together with the first connection part 17. For example, the second connection part 23 may be provided to connect the pair of board contact parts 21 such that the board contact parts 21 are located at the outermost positions of the lattice pattern formed by the board contact parts 21 of the board 20. As illustrated in FIG. 2, the second connection parts 23 connect four board contact parts 21 located at the outermost positions with each other in pairs, so that second connection parts 23 are alternately arranged with respect to the first connection part 17 through the contact members 19, thereby forming the circuit line. The second connection part 23 is made of a conductive metal line to connect the pairs of the board contact parts 21 with each other. Alternatively, the second connection part 23 may have various other shapes that connect the pairs of the board contact parts 21 with each other. Thus, the first connection part 17 and the second connection part 23 are made of the metal line to form the circuit line, which may be shaped like a daisy chain. The corresponding patterns formed by the package pins 11 and the board contact parts 21 may have other shapes that are different from the lattice pattern illustrated in FIG. 2. In this case, the first and second connection parts 17 and 23 may also have different shapes. The first and second connection parts 17 and 23 are used to connect the NC pins 15 and the corresponding board contact parts 21 using paths along the lattice pattern and through the corresponding contact members 19, and the paths along the lattice pattern alternate between the package 10 and the board 20.

The test points 25 are provided on opposite ends of the circuit line formed by the first and second connection parts 17 and 23. For example, the test points 25 may be positioned on the board 20 to measure a resistance of the contact members 19 provided between the first and second connection parts 17 and 23. Alternatively, the test points 25 may be positioned in the package 10. As illustrated in FIG. 2, the test points 25 are electrically connected with the pair of board contact parts 21 connected with the first connection part 17 through the contact members 19. The test points 25 are connected to the pair of board contact parts 21 through a point connector 27. Thus, a user can measure the resistance of the contact members 19 provided between the first connection part 17 and the second connection part 23 to determine a connection state of the contact members 19 based on the measured resistance. The determined connection state may indicate a defective connection that is caused by a crack in one of the contact members 19.

The point connector 27 may be made of the metal line similar to the second connection part 23 to electrically connect the pair of board contact parts 21 with the test points 25.

With this configuration, the test unit 1 according to the present embodiment of the present general inventive concept is operated as follows.

First, the package 10 is connected to the board 20 using the plurality of contact members 19. A user then measures the resistance at each of the test points 25 and thus checks the connection state of the contact members 19 provided between the first connection part 17 and the second connection part 23 based on the resistance measured at each of the test points 25. Then, a power is supplied to the board 20, so that the electronic component 12 operates for a predetermined period of time. As the electronic component 12 operates, the package 10 may be heated and expanded. The user then measures the resistance again at each of the test points 25 to re-check the connection state of the contact members 19 provided between the first connection part 17 and the second connection part 23. Re-checking the connection state allows the user to detect any cracks or defective connections that may have occurred during operation of the electronic component 12. For example, when the measured resistance is higher than a preset resistance, the user can determine that one or more of the contact members 19 has a crack "A" and the connection state is defective. This process of inspecting the contact members 19 for the defective connection can either be performed after mounting the package 10 to the board 20 or after completely assembling a product comprising the board 20 with the package 10 mounted thereon.

Thus, the test unit 1 according to the present embodiment of the general inventive concept comprises the first connection part 17 provided in the package 10 to electrically connect the plurality of NC pins 15 with each other in pairs, the second connection part 23 provided on the board 20 to electrically connect the plurality of corresponding board contact parts 21 with each other in pairs to form the circuit lines arranged alternately with respect to the first connection part 17 through the contact members 19 and the test points 25 provided on the opposite ends of the circuit line to measure the resistance between the first and second connection parts 17 and 23 such that the connection state of the contact members 19 can be inspected without difficulty.

Figure 4:
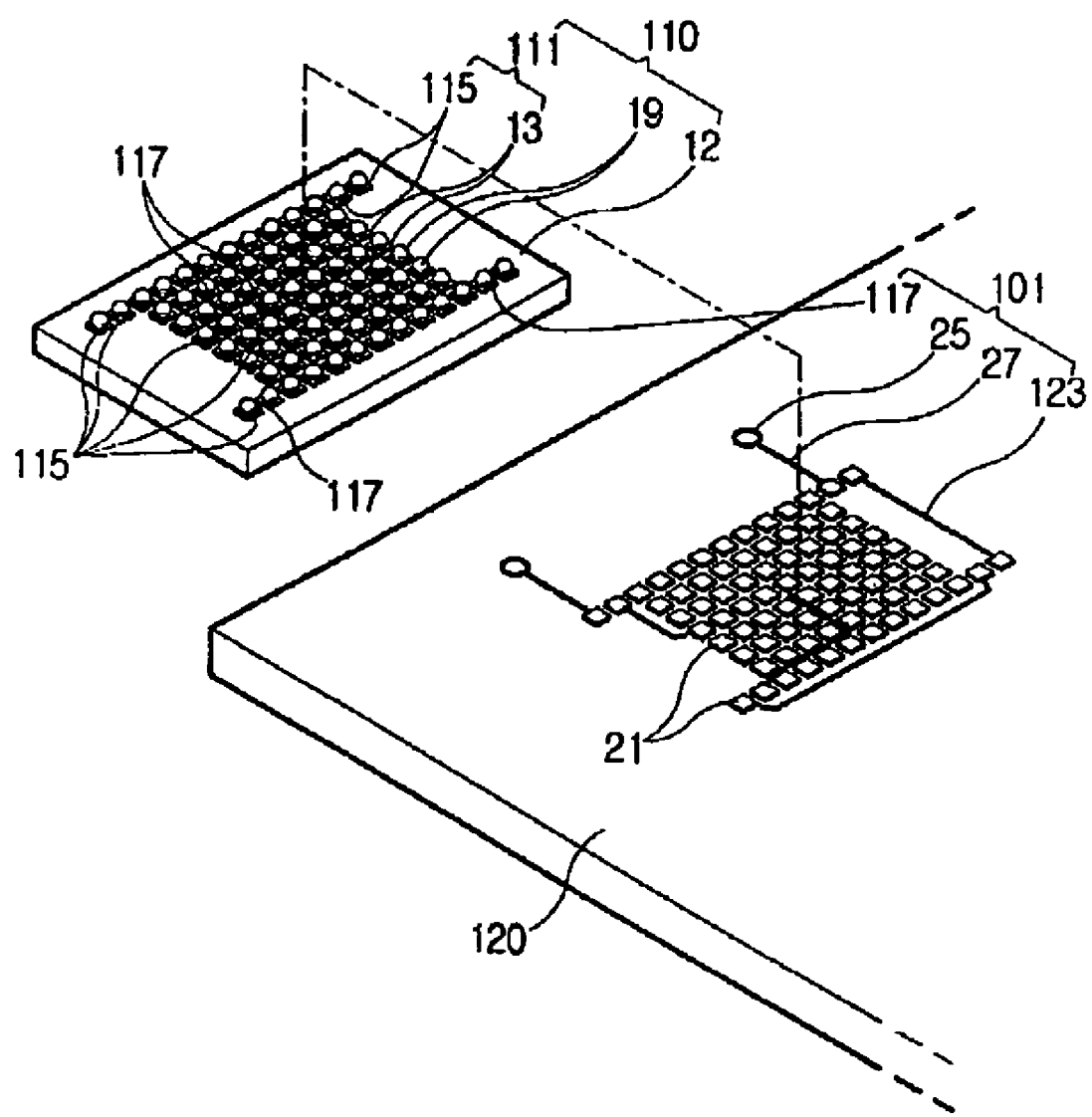
FIG. 4 is an exploded perspective view illustrating a package and a board with a test unit according to another embodiment of the present general inventive concept.

FIG. 4 is an exploded perspective view illustrating a package 110 and a board 120 with a test unit 101 according to another embodiment of the present general inventive concept. Contrary to the previous embodiment, NC pins 115 of the package 110 can be positioned in various locations, such as the outermost positions, a center area, or the like, of a pattern formed by package pins 111. Further, according to the present embodiment of the general inventive concept, a plurality of first connection parts 117 are provided to connect the pairs of the NC pins 115 with each other, and a plurality of second connection parts 123 are provided to connect the pairs of the board contact parts 21 that correspond to the NC pins 115 with each other, thereby arranging the second connection parts 123 and the first connection parts 117 alternately. In other words, the first and second connection parts 117 and 123 form a circuit line by connecting the NC pins 115 and the corresponding board contact parts 21 through the contact members 19 along alternating paths of the pattern formed by the package pins 111 and the board contact parts 21.

As illustrated in FIG. 4, the NC pins 115 may be freely selected from among the package pins 111 by a user.

The first connection parts 117 are provided in the package 110 and electrically connect the pairs of the NC pins 115 with each other. The first connection parts 117 connect the pairs of the NC pins 115, which are connected with contact members 19 to be inspected, with each other among the plurality of the contact members 19 that are connected with the corresponding board contact parts 21.

The second connection parts 123 connect the board contact parts 21 with each other to form the circuit line arranged alternately with the first connection parts 117 through the contact members 19.

The test unit 101 according to the present embodiment measures a resistance through the test points 25, thereby facilitating inspection of the contact members 19 provided between the first and second connection parts 117 and 123 for cracks and a defective connection state.

As described above, the various embodiments of the present general inventive concept provide a test unit to test a board having an area array package mounted thereon, in which a connection state of a contact member is easily inspected without difficulty.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A test unit to test a board having an area array package mounted thereon, the test unit comprising:
    the board;
    the area array package comprising:
    an electronic component,
    a plurality of package pins including a plurality of contact pins connected with the electronic component and a plurality of no-contact pins not connected with the electronic component, and
    a plurality of contact members respectively provided on the plurality of contact pins and the plurality of no-contact pins to connect the plurality of package pins with the board;
    a plurality of board contact parts provided on the board and connected with the plurality of contact members to be connected with the plurality of package pins;
    at least one first connection part provided in the area array package to electrically connect the plurality of no-contact pins with each other in pairs;
    at least one second connection part provided on the board to electrically connect the plurality of board contact parts with each other in pairs to form a circuit line arranged alternately with the first connection part through the plurality of contact members; and
    at least one test point provided at opposite ends of the circuit line to measure a resistance between the first and second connection parts.

2. The test unit according to claim 1, wherein at least one of the plurality of no-contact pins that is selected to form the at least one first connection part comprises an outermost package pin.

3. The test unit according to claim 1, wherein the first and second connection parts comprise a conductive metal line.

4. The test unit according to claim 3, wherein the area array package comprises a ball grid array package and the plurality of contact members comprise a plurality of solder balls.

5. The test unit according to claim 1, wherein the at least one test point is provided on the board and is electrically connected to a pair of board contact parts that are connected with the first connection part through the plurality of contact members.

6. The test unit according to claim 5, wherein the area array package comprises a ball grid array package and the plurality of contact members comprise a plurality of solder balls.

7. The test unit according to claim 1, wherein the area array package comprises a ball grid array package and the plurality of contact members comprise a plurality of solder balls.

* * * * *